United States Patent [19]
Kimura et al.

[11] 3,972,063
[45] July 27, 1976

[54] VAPOR COOLED SEMICONDUCTOR DEVICE ENCLOSED IN AN ENVELOPE HAVING A COMPRESSION MECHANISM FOR HOLDING SAID DEVICE WITHIN SAID ENVELOPE

[75] Inventors: Yoshio Kimura; Hiroshi Mitsuoka; Isamu Hosono, all of Amagasaki, Japan

[73] Assignee: Mitsubishi Denki Kabushiki Kaisha, Tokyo, Japan

[22] Filed: Oct. 10, 1974

[21] Appl. No.: 513,924

[30] Foreign Application Priority Data
Oct. 19, 1973   Japan............................. 48-117620
Nov. 10, 1973   Japan............................. 48-126989

[52] U.S. Cl.................................... 357/82; 357/79; 165/80; 165/105; 174/16 HS
[51] Int. Cl.²................... H01L 25/04; H01L 23/42; H01L 23/44; H01L 23/46
[58] Field of Search............ 357/81, 82, 79; 165/80, 165/105; 174/16

[56] References Cited
UNITED STATES PATENTS

| | | |
|---|---|---|
| 2,780,757 | 2/1957 | Thornhill et al..................... 357/82 |
| 3,307,087 | 2/1967 | Rogers et al.......................... 357/82 |
| 3,649,738 | 3/1972 | Andersson et al.................... 357/82 |
| 3,654,528 | 4/1972 | Barkan................................. 357/82 |
| 3,703,668 | 11/1972 | Bylund et al.......................... 357/82 |
| 3,743,893 | 7/1973 | Yamomoto........................... 357/82 |
| 3,826,957 | 7/1974 | McLaughlin.......................... 357/82 |
| 3,834,454 | 9/1974 | Gammel et al. ...................... 357/82 |

*Primary Examiner*—Andrew J. James
*Attorney, Agent, or Firm*—Wenderoth, Lind & Ponack

[57] ABSTRACT

A stack including a semiconductor element and the associated components is held within a lower portion of a hermetic envelope between its side wall and a closure block movably secured to its opposite side wall to close an opening on the latter and is immersed into a cooling liquid boilable adjacent the operating temperature of the semiconductor element. A pressing plate fixed to the opposite side wall resiliently presses the closure block to apply a compressible contact force to the semiconductor element. The stack may be sandwiched between two closure blocks closing the opposite opening on the bilateral walls of the lower envelope portion and pressed toward each other by two spherical segment of resilient material arranged back-to-back. Alternatively the stack may be carried between the bilateral envelope walls through a resilient spherical segment.

18 Claims, 5 Drawing Figures

VAPOR COOLED SEMICONDUCTOR DEVICE ENCLOSED IN AN ENVELOPE HAVING A COMPRESSION MECHANISM FOR HOLDING SAID DEVICE WITHIN SAID ENVELOPE

BACKGROUND OF THE INVENTION

This invention relates to improvements in a vapor cooled semiconductor device in which a semiconductor element involved is cooled through the utilization of a latent heat of vaporization of a cooling liquid.

The conventional type of vapor cooled semiconductor devices has been very high in the capability to cool the semiconductor element but has been disadvantageous in view of the construction. Since the semiconductor stack including the semiconductor element and the associated components and the mechanism for pressurizing and holding the stack have been constructed separately from the associated enclosed envelope, the semiconductor devices as a whole have been increased in the number of components and complicated in structure. Also, an increase in capacity of the semiconductor element has resulted in a higher compressive contact force required for the semiconductor element and therefore in the necessity of imparting to the associated pressurizing mechanism a mechanical strength sufficient to withstand such a higher compressive contact force. This has inevitably made the pressurizing mechanism and, therefore the entire device large-sized while increasing the amount of a cooling liquid used, thus leading to an expensive device.

The disadvantages as above described have been remarkable particularly for the single stack including a small number of semiconductor elements. For this reason, high capacity semiconductor devices have been frequently manufactured by incorporating a multiplicity of semiconductor elements into a single stack and disposing the stack in the associated enclosed envelope. This measure has been inconvenient in the maintenance because, for example, the failure of any one of the semiconductor elements has necessarily led to the replacement of the entire device including the enclosed envelope.

SUMMARY OF THE INVENTION

Accordingly it is a general object of the present invention to eliminate the disadvantages of the prior art practice as above described.

It is an object of the present invention to provide a new and improved, vapor cooled semiconductor device simple in construction, small in size, light in weight and simplified in assembling.

It is another object of the present invention to provide a vapor cooled semiconductor device including an improved enclosed envelope small in size.

It is still another object of the present invention to provide a new and improved structure of a vapor cooled semiconductor device suitable for a small number of semiconductor elements or a single semiconductor element.

The present invention accomplishes these objects by the provision of a vapor cooled semiconductor device comprising, in combination, an envelope including an opening, a semiconductor stack including at least one semiconductor element sandwiched between a pair of heat dissipation blocks, the semiconductor stack being disposed within the envelope, means for hermetically closing the opening of the envelope and simultaneously pressurizing and holding the semiconductor stack within the envelope, and an amount of a cooling liquid charged in the envelope hermetically enclosed with the closing means to leave a space within the envelope whereby the semiconductor stack is cooled through the utilization of the latent heat of vaporization of the cooling liquid.

BRIEF DESCRIPTION OF THE DRAWINGS

The present invention will become more readily apparent from the following detailed description taken in conjunction with the accompanying drawings in which.

Throughout the FIGS. like reference numerals designate the identical or similar components.

DESCRIPTION OF THE PREFERRED EMBODIMENTS

Figure 1:
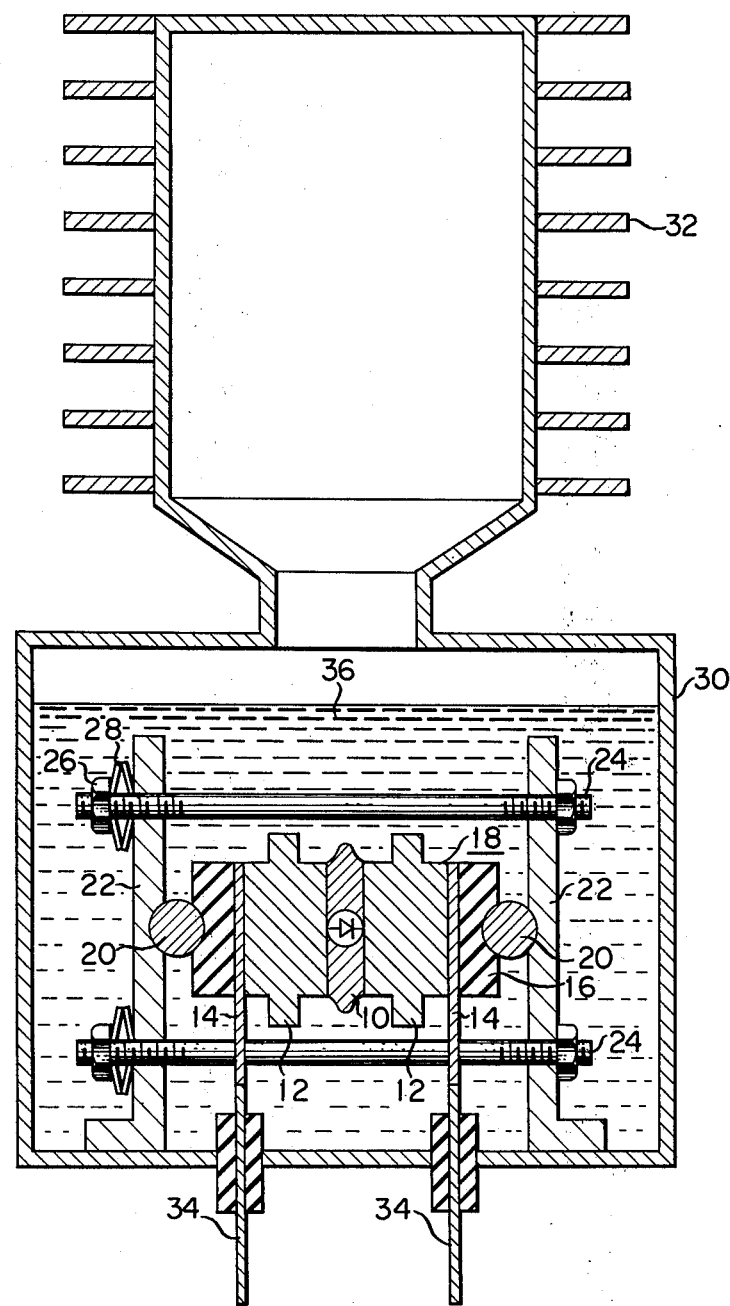
FIG. 1 is a longitudinal sectional view of a vapor cooled semiconductor device constructed in accordance with the principles of the prior art.

Referring now to the drawings and FIG. 1 in particular, there is illustrated a vapor cooled semiconductor device constructed in accordance with the principles of the prior art. The arrangement illustrated comprises a flat semiconductor element 10 such as a power semiconductor diode sandwiched between a pair of opposite heat dissipation blocks 12 formed of a material good in thermal and electric conductivities, for example, copper or the like, and a pair of electrode conductors 14 in the form of sheets held between the mating heat dissipation blocks 12 and electric insulations 16 to provide terminals for the semiconductor element 10. The assembly of the semiconductor element 10, the heat dissipation blocks 12, the electrode conductors 14 and the electric insulations 16 thus assembled forms a semiconductor stack generally designated by the reference numeral 18 and carried between a pair of pressing plates 22 disposed in spaced parallel relationship, through spheres 20 rested in spherical seats disposed on both the electric insulations 16 and the pressing plate 22 to be complementary in shape to the spheres 20. The spherical seats and therefore the spheres are located on the central longitudinal axis of the semiconductor element 10. Then a plurality of locking bolts 24 extend in spaced parallel relationship through the outer peripheral portions of the pressing plates 22 and are fastened on both end portions to the mating plates 22 through nuts 26 screw threaded thereonto. One end portion, in this case, the left hand end portion as viewed in FIG. 1 of each bolt 24 is fastened to the adjacent pressing plate 22 by the nuts 26 through a resilient member 28 shown as comprising a pair of opposite dish-shaped leaf springs for the purpose as will be apparent hereinafter.

In this way the stack 18 including the components 10, 12, 14 and 16 and a combined pressing and holding mechanism formed of the components 22, 24, 26, and 28 are connected together into a unitary structure with the stack 18 held in place through the spheres 20.

The locking bolts 24 cooperate with the nuts 26 to apply to each main face of the semiconductor element 10 a compressive contact force sufficient to maintain the semiconductor element 10 in good compressive contact with the heat dissipation blocks 12. Also the spheres 18 cooperate with their spherical seats disposed on both the electric insulations and pressing plates 16 and 22 respectively to prevent the compressive contact force from being unevenly applied to the semiconductor element 10 ensuring that the latter is contacted by the heat dissipation plates 12 under a uniform pressure. Further the resilient members 28 are effective for accommodating any change in the compressive contact force due to thermal expansion of the associated components. Thus the semiconductor element 10 has a fixed compressive contact force always applied thereto.

The arrangement further comprises a hermetically enclosed envelope 30 including an upper portion having a plurality of heat dissipation fins 32 disposed on the outer periphery thereof and a lower portion put in fluid communication with the upper portion through a neck portion. The stack 18 is fixedly disposed in place within the lower portion of the envelope 30 as by having the pressing plates 22 formed into a L shape one leg of which is fixed on the bottom of the envelope 30 with the electrode conductors 14 connected to respective current terminals 34 extended and sealed in electrically insulated relationship through the bottom wall of the envelope 30. Also a cooling liquid 36 is charged in the lower portion of the envelope 30 to such a level that the stack 18 is fully immersed thereinto while a narrow space is left above the surface of the cooling liquid within the lower envelope portion. The cooling liquid 36 is required to be good in electrically insulating property and able to boil at a temperature approximating the operating temperature of the semiconductor element 10.

It is noted that the upper portion of the envelope 30 is evacuated and filled only with a saturated vapor from the cooling liquid but not with any incompressible gas. This is desirable in view of an increase in the cooling effect.

When the semiconductor element 10 is supplied with an electric current to rise in temperature, the heat dissipation blocks 14 increase in temperature until that portion of the cooling liquid 36 contacting the dissipation blocks 14 is initiated to boil. At that time, heat generated by the semiconductor element 10 is removed as the latent heat of vaporization of the cooling liquid whereby the semiconductor element 10 is strongly cooled. A vapor evaporated from the cooling liquid 36 through its boiling is upwardly moved into the upper portion of envelope 30 where it is condensed into a liquid on the internal surface thereof to be deprived of its heat. Thereafter the liquid falls along the internal wall of the upper portion of the envelope 30 to be accumulated in the lower portion thereof. The process as above described is repeated. That is, the cooling liquid 36 is repeatedly evaporated and liquidized in the hermetically enclosed envelope 30 to cool the semiconductor element 10. The cooling through the utilization of latent heat of vaporization due to the boiling is much higher in a rate of heat transfer as compared with the cooling due to the convection of air, oil, water or the like, resulting in an extremely high capability to cool the semiconductor element 10.

Although the vapor cooling has the advantages as above described, vapor cooled semiconductor devices of the conventional construction have been structurally disadvantaged in the following respects. In the prior art type devices, the stack including a semiconductor element and heat dissipation blocks etc., along with the pressurizing mechanism comprising pressing plates locking bolts etc. such as shown in FIG. 1 has been formed quite separately from the associated hermetic envelope such as shown at 30 in FIG. 1. This has resulted in both an increase in the number of components composing the entire device and a complicated structure. Accordingly, the number of the manufacturing steps has been increased. Also an increase in the capacity of semiconductor devices is attended with an increase in the compressive contact force required for the semiconductor element involved. Thus it has been necessary to impart to the associated pressurizing mechanism a mechanical strength sufficient to withstand such a high compressive contact force resulting in the pressuring mechanism including the stack being fairly large in size. Therefore a hermetically enclosed envelope for housing such a large pressurizing mechanism with the semiconductor stack has been necessarily large in shape while a larger amount of a cooling liquid should be charged in the envelope. As a result the device as a whole has been increased in both size and weight leading to an increase in manufacturing cost.

The disadvantages of the prior art practice as above described have been remarkable particularly for a small number of semiconductor elements assembled into a single stack such as the stack 10 shown in FIG. 1. Thus it has been, in many cases, previously practiced to assemble a multiplicity of semiconductor elements into a single stack and then disposing the stack within a single hermetic envelope to form a high capacity semiconductor device. This measure has been inconvenient in view of the maintenance. For example, if even a single one of the semiconductor elements disposed within the envelope would have been disabled then the entire device or the large envelope in the entirety has been required to be replaced by a new one.

The present invention contemplates eliminating the disadvantages of the prior art practice by providing of a vapor cooled semiconductor device including a hermetically enclosed envelope and a pressurizing mechanism incorporated into a unitary structure.

Figure 2:
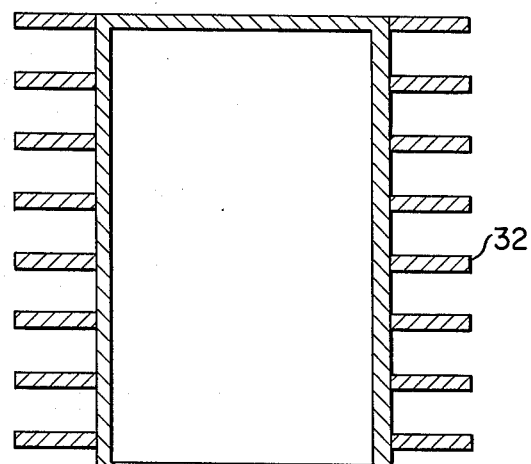
FIG. 2 is a longitudinal sectional view of a vapor cooled semiconductor device constructed in accordance with the principles of the present invention.

Referring now to FIG. 2, there is illustrated a vapor cooled semiconductor device constructed in accordance with the principles of the present invention. In FIG. 2 it is seen that the semiconductor stack 18 as above described in conjunction with FIG. 1 is carried at one end, in the example illustrated, the righthand end as viewed in FIG. 2 to the adjacent side wall of the envelope 30 through sphere 20 interposed therebetween on the longitudinal axis of the semiconductor element 10.

The stack 18 has the other or lefthand end abutting against a larger end face of a T-shaped metallic closure block 38 including a smaller end face provided with a spherical seat 38A on the longitudinal axis of the semiconductor element 10 similar to that provided on the electric insulation 16 as shown in FIG. 1. Then a bellows member 40 expandable and contractable axially of the semiconductor element 10 is fixedly secured on one end portion to the T-shaped closure block 38 on the peripheral surface of the larger end portion as by welding or brazing and extends through an opening 42 disposed on that side wall opposite to the side wall of the envelope 30 adjacent to the one end of the stack 18. The bellows member 40 surrounds the closure block 38 and has the other end welded or brazed to an outwardly directed flange 44 subsequently fixed to the outer surface of the adjacent side wall of the envelope 30 as by welding. The closure block 38, the bellows member 40 and the flange 44 hermetically close the opening 42 together and form a part of the hermetically enclosed envelope 30. If desired, the flange 44 may be hermetically fixed to the envelope 30 through any suitable sealing means such as an O ring.

The envelope 30 has a plurality of, for example, three or four locking bolts 24 suitably planted on the peripheral portion of the outer surface of that side wall to which the flange 44 is fixed. These locking bolts 24 are extended through a pressing plate 22 and fastened thereto through resilient members 28 and the nuts 26 similar to those shown in FIG. 1.

In other respects the arrangement is identical to that shown in FIG. 1.

Upon assembling the arrangement as shown in FIG. 2, the sphere 20 first rests on the spherical seat disposed on the inner surface of that side wall opposite to the opening 42 of that envelope 30 and then the spherical seat on the electric insulation 16 abuts against the sphere 20. Thereafter, the electrode conductor 14, the heat dissipation block 12, the semiconductor element 10, the heat dissipation block 12, the electrode conductor 14 and the electric insulation 16 are succeedingly superposed in the named order upon that electric insulation 16 disposed on the sphere 20 followed by the connection of the electrode conductors 14 to the insulated current terminals 34. Then the closure mechanism 38, 40 – 44 is inserted into the opening 42 until it abuts against the exposed end surface of the electric insulation 16. At that time the flange 44 hermetically closes the opening 42 as above described, whereupon the hermetically enclosed envelope 30 has been completed within which the semiconductor element 10 is disposed in place. Under these circumstances, the bellows member 40 is compressed to such an extent that the semiconductor element 10 and the associated components forming the stack 18 are maintained in slightly compressive contact.

Then another sphere 20 rests on the spherical seat 38A on the closure block 38 and the pressing plate 22 abuts against the sphere 20 by having it spherical seat put on the sphere 20 with the locking bolts 24 threading through the pressing plate 22. Following this the nuts 26 are screw threaded onto the respective locking bolts 24 to fasten them to the plate 22 through the resilient members 28 until the required compressive contact force is applied to the semiconductor element 10. At that time, the closure block 38 may receive a fastening force exerted by the nuts 26 to be more or less moved toward the side of the semiconductor element 10 to change in dimension. This change in dimension is accommodated by the bellows member 40. That is, the bellows member 40 is somewhat expanded as compared with the provisional assembling of the stack 18. Therefore no mechanical strain occurs in both the flange 44 and the hermetically enclosed envelope 30. In this way the assembling operation has been completed while at the same time the required compressive contact force is applied to the semiconductor element 10.

From the foregoing it will be appreciated that the arrangement of FIG. 2 retains the advantages of the prior art practice as above described in conjunction with FIG. 1. In addition, the arrangement can be small in size, light in weight and simplified in assembling because the stack 18 is held at the end by the closure mechanism 38 – 40 – 44 forming a part of the hermetically enclosed envelope 30 while the required compressive contact force can be externally applied to the semiconductor element 10 through the bellows member 40.

Figure 3:
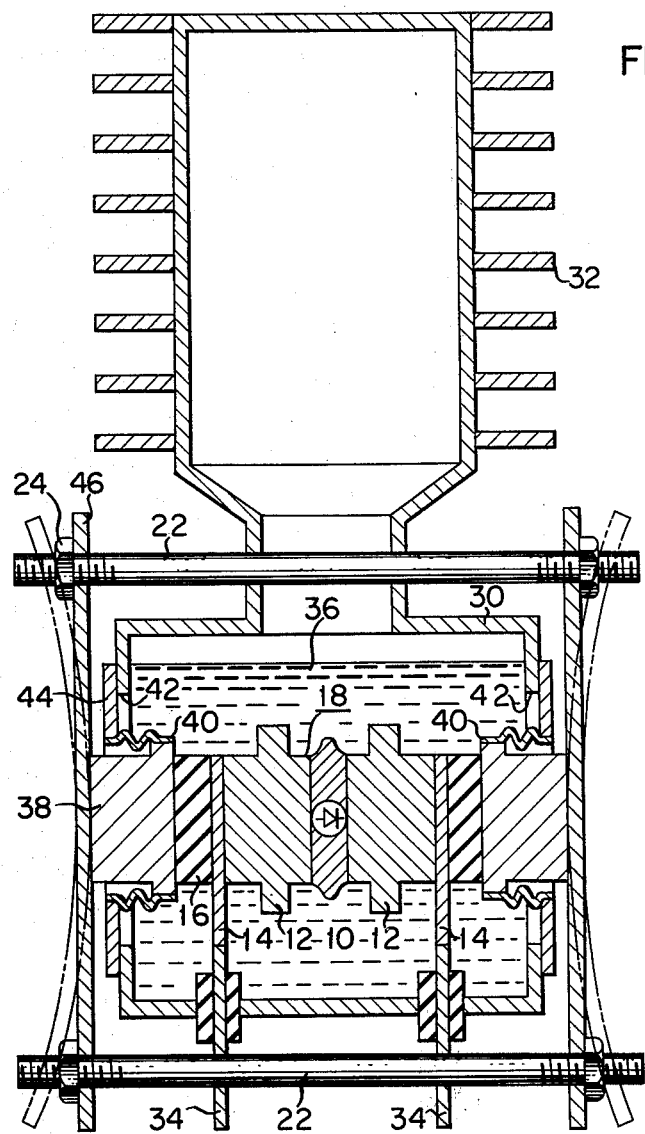
FIG. 3 is a longitudinal sectional view of a modification of the present invention.

FIG. 3 illustrates a modification of the present invention wherein the closure mechanism including the closure block 38, the bellows member 40 and the flange 44 as shown in FIG. 2 are disposed on each of the bilateral sides of the envelope 30. As shown in FIG. 3, the envelope 30 is provided on the righthand wall with an opening 42 identical and opposite to that on the lefthand wall thereof similar to the opening 42 as shown in FIG. 2. Then the closure mechanism including the metallic closure block 38, the bellows member 40 and the flange 44 such as shown FIG. 2 is used to hermetically close each of the openings 42 in the same manner as above described in conjunction with FIGS. 2.

In the arrangement of FIG. 3, however, that end face of each closure block 38 remote from the electric insulation 16 is flat and has the central portion of a pressing resilient plate 46 directly abutting against the same. The pressing plate is operatively connected to another pressing resilient plate 46 identical thereto through a plurality of locking bolts 24 extending through the peripheral portions of both plates, 46 and nuts 26 as in the arrangement of FIG. 1. Thereby, the pressing resilient plates 46 maintain the semiconductor stack 18 therebetween through the closure blocks 38 to apply the required compressive contact force to the semiconductor element 10.

In other respects the arrangement is identical to that shown in FIG. 2 except for the omission of the resilient members 28.

The pressing plate 46 is formed of any suitable resilient material and refined. Then the plate is subject to shot peening to increase in elastic limit. The plate thus treated is formed into a spherical segment under unloading as shown at dotted line in FIG. 3. The shape and curvature of the spherical segment under unloading has been determined so that, as shown at solid line in FIG. 3, it becomes flat in response to the application of the required concentrated load to the apex thereof through the nuts 26 screw threaded onto the locking blots 24. A pair of resilient plates 46 on the form of spherical segments thus prepared are operatively interconnected back to back through the locking bolts 24 and nuts 26 respectively.

Therefore the pressing plates 46 provide plate springs for applying the required compressive contact force to the semiconductor element 10 while at the same time performing the function of accommodating a change in the compressive contact force resulting from the thermal expansion of the associated components and so on. Further at the beginning of the locking operation, the pressing plate 46 has the central portion in the form of a spherical segment and therefore can perform the operation of automatically centering the semiconductor stack 18. As the locking operation proceeds, the plates 46 become flat to impart a uniform compressive contact force to the semiconductor element 10 throughout the contact area thereof. This results in the elimination of the necessity of operatively associating the spheres 20 with to the closure blocks 38 as in the arrangement of FIG. 2.

The arrangement of FIG. 3 is advantageous in that it is simple in construction and easily assembled. This is because the pressing plate or plate spring 46 preliminarily having a spherical segment performs the combined function of bringing the semiconductor element 10 into compressive contact with the adjacent components, retaining the contact pressure required for the semiconductor element and rendering that pressure uniform, and also because the pressing plates 46 are used to apply a compressive contact force to the closure blocks 46 outside of the hermetically enclosed envelope 30, thereby eliminating the components such as the pressing plates 22, the resilient members 28 the spheres 20 etc. used in assembling the stack 18 within the envelope 30 as shown in FIG. 1. In addition, there is no necessity of machining the spherical seat on the electric insulation 16 as shown in FIG. 1 or 2.

Also due to the bilateral symmetry of the structure the closure blocks 38, the bellows member 40 and the flange 44 can be of common components respectively resulting in the facilitation of the standarization in view of the assembling. Further the pressing plate is not required to be formed of thick plate steel so as to withstand excessive compressive contact forces. Thus the arrangement can be decreased in the total weight. Also, an assembly including the semiconductor stack 18 sandwiched between the pressing plates 46 through the closure blocks 38 can have its outside dimension equal to or less than that of the corresponding assembly as shown in FIG. 1 which has been previously disposed in the envelope.

It is to be understood that the pressing resilient plate 46 may be substituted for the pressing plate 22 as shown in FIG. 2 with the resilient members 28 omitted.

Figure 4:
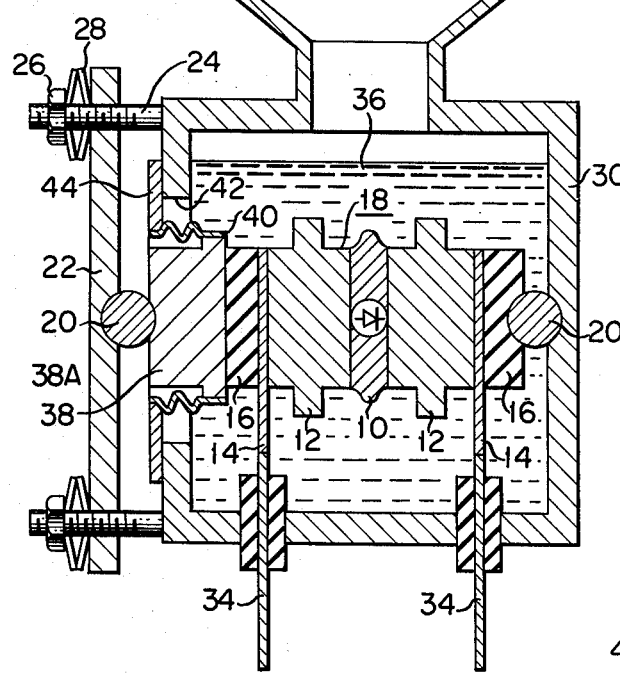
FIG. 4 is a longitudinal sectional view of another modification of the present invention.
Figure 4:
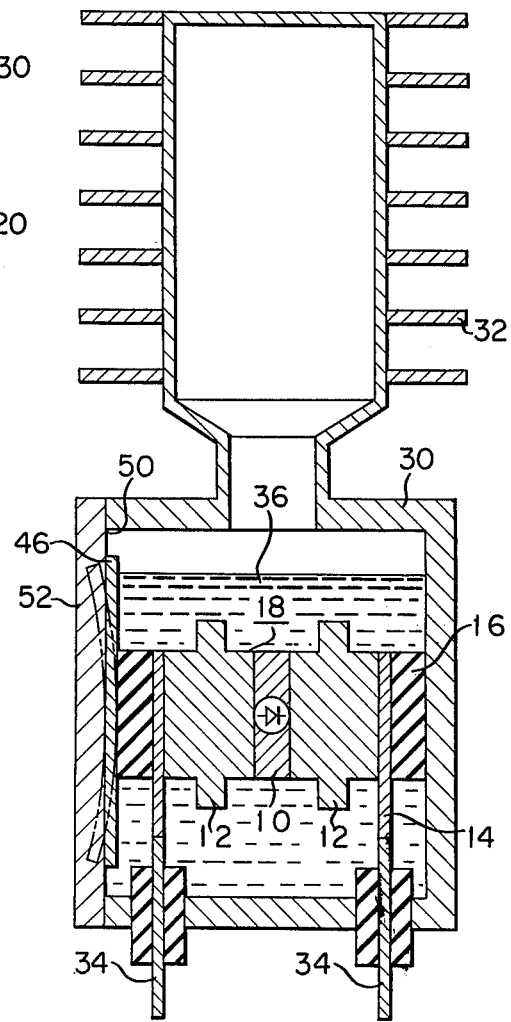

FIG. 4 shows another modification of the present invention further simplified in construction. The envelope 30 is shown in FIG. 4 as including a lower portion having one of lateral sides opened to form an opening 50. A semiconductor stack 18 such as above described in conjunction with FIG. 1 is inserted into the lower portion of the envelope 30 from the opening 50. Until one end face thereof abuts against the inner surface of the lateral side. After the electrode conductors 14 of the stack 18 have been connected to the insulated current terminals 34 extended and sealed through the bottom wall of the envelope 30, a resilient plate 46 in the form of a sphericul segment (shown at dotted line FIG. 4) such as described in conjunction with FIG. 3 is caused to abut against the other end face of the stack 18 within the opening 50. Following this a pressing plate 52 is connected to the open side of the envelope 30 as by welding to hermetically close the opening 50 as well as abutting against the resilient plate 40 to apply the required compressive contact force to the semiconductor element 10 of the stack 18 through the resilient plate 46 now substantially flat.

In other respects the arrangement is identical to that shown in FIG. 3.

The pressing plate 52 is dimensioned such that no clearance between the same and the edge face of the opening 50 occurs with the required compressive contact force applied to the semiconductor element 10 through the resilient plate 46 from the pressing plate 52.

In the arrangement of FIG. 4, it will be appreciated that the pressing plate 52 forms a pressurizing member for applying the required compressive contact force to the semiconductor element 10 as well as forming a part of the wall of the hermetically enclosed envelope 30. That is, the resulting envelope 30 is of a structure by which it has the semiconductor element disposed therein and a pressurizing mechanism for the semiconductor element integrated therewith. This eliminates the necessity of using locking bolts, nuts etc. such as shown in FIG. 1 as well as decreasing the number of the manufacturing steps resulting in the simplification of the assembling operation. Further due to the pressing plate 46 forming a part of the wall of the envelope 30, the lateral dimension of the envelope in a direction in which the compressive contact force is applied to the semiconductor element is sufficient to be as long as the longitudinal dimension of conventional semiconductor stacks.

Figure 5:
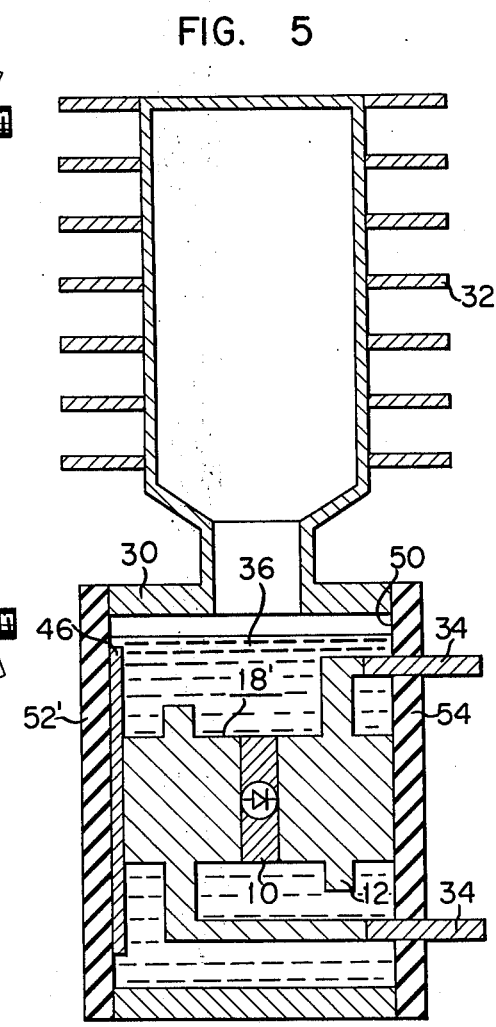
FIG. 5 is a longitudinal sectional view of still another modification of the present invention.

FIG. 5 shows a modification of the arrangement as shown in FIG. 4. As shown in FIG. 5, the envelope 30 includes its lower portion having bilateral sides open to form a pair of opposite openings 50. One of the openings 50 in this case, the right hand one thereof is hermetically closed with an electrically insulating plate 54 as by brazing with a pair of spaced current terminals 34 extended and sealed through the insulating plate 54. A semiconductor stack 18' including a semiconductor element 10 sandwiched between a pair of heat dissipation blocks 12 is disposed within the lower envelope portion by having one end face abutting against the inner surface of the insulating plate 54. The heat dissipation blocks 12 have L-shaped protrusions connected to the current terminals 34 respectively. Then the other opening 50 is hermetically closed with an electrically insulating plate 52' while a resilient plate 46 similar to that shown in FIG. 4 is interposed between the plate 52' and the other end face of the stack 18' as in the arrangement of FIG. 4.

In other respects the arrangement in identical to that shown in FIG. 4.

In the arrangement of FIG. 5, the heat dissipation blocks 12 also serve as the electrode conductors for the semiconductor element 10 and the electric insulations 15 as shown in FIG. 4 are omitted. Thus the arrangement includes fewer components than that shown in FIG. 4, resulting in a simplified construction, decrease in both dimension and weight, and therefore, in a reduction in cost.

As above described, the present invention is advantageous in that the resulting devices are small-sized, light in weight, simplified in manufacturing and so on. This is because the pressurizing mechanism is constructed integrally with the hermetically enclosed envelope. In addition, the lower envelope portion has the flexibility of the shape. For example, it may be of a hollow cylindrical shape. Also the structure of vapor cooled semiconductor devices has been previously applied only to semiconductor devices including a relative large number of semiconductor elements by considering the problems of manufacturing them, their economics etc. but the present invention has made it possible to satisfactorily apply such a structure to each semiconductor device including a single semiconductor element in view of the manufacturing and economics. Furthermore, the present devices are high in the cooling effect and include the semiconductor element completely enclosed with the envelope with cooling fins electrically insulated as well as being subject to no limitation as to use and environment and are high in reliability.

While the present invention has been illustrated and described in conjunction with several preferred embodiments thereof it is to be understood that numerous changes and modifications may be resorted to without departing from the spirit and scope of the present invention.

What is claimed is:

1. A vapor-cooled semiconductor device, said device comprising:
    an envelope having at least one side wall with an opening therethrough;
    a semiconductor stack fitted within said envelope with one end directed toward said opening, said stack comprising:
        a pair of heat-dissipation blocks,
        at least one semiconductor element sandwiched between said dissipation blocks,
        at least two electrodes, one on each side of said dissipation blocks opposite the side contacting said semiconductor element, said electrodes extending through said envelope wall, and
        electrical insulation against the sides of said electrodes opposite the sides thereof contacting said heat dissipation blocks;
    sealing and pressurizing means fitted through said opening in said envelope and adjacent said semiconductor stack for hermetically closing said opening, pressurizing said envelope and holding said semiconductor stack within said envelope; and
    cooling fluid partially filling said sealed envelope surrounding said stack, whereby said semiconductor element is cooled by the latent heat of vaporization of said cooling fluid.

2. A vapor cooled semiconductor device comprising:
    an envelope having at least one side wall with an opening therethrough;
    a semiconductor stack fitted within said envelope with one end directed toward said opening, said stack comprising:
        a pair of heat dissipation blocks,
        at least one semiconductor element sandwiched between said heat dissipation blocks,
        at least two electrodes, one on each side of said heat dissipation blocks opposite the side contacting said semiconductor element, said electrodes extending through said envelope wall, and
        electrical insulation against the sides of said electrodes opposite the sides thereof contacting said heat dissipation blocks;
    closure means attached over and expandably fitted through said opening in said side wall of said envelope and abutting against one end of said semiconductor stack for hermetically closing said opening;
    pressurizing means connected to said envelope and positioned adjacent said closure means for pressing against said closure means, whereby said semiconductor stack contacting said closure means is pressurized and held within said envelope; and
    cooling fluid partially filling said sealed envelope and surrounding said semiconductor stack, whereby said semiconductor element is cooled by the latent heat of vaporization of said cooling fluid.

3. A device as claimed in claim 2, wherein said semiconductor stack abuts the side wall of said envelope opposite the side wall with said opening therethrough.

4. A device as claimed in claim 2, wherein said closure means is comprised of:
    a flexible bellows member hermetically sealed in said opening through said side wall of said envelope; and
    a closure member connected to said bellows member, abutting said semiconductor stack at one end thereof and said pressurizing means at the other end thereof.

5. A device as claimed in claim 2, wherein said pressurizing means is movably secured to said side wall having said opening therethrough and is comprised of:
    pressing plate means adjacent said closure means for abutting against said closure means;
    a sphere member between said pressure plate means and said closure means; and
    a resilient member located against the side of said pressure plate means opposite the side contacting said sphere member for resiliently pressing said pressing plate means and said sphere member toward said closure means.

6. A device as claimed in claim 5, further comprising a second sphere member positioned between the side wall of said envelope opposite the sidewall having the opening therethrough and the end of said semiconductor stack opposite the end abutting said closure means.

7. A device as claimed in claim 2, wherein said pressurizing means is comprised of a resilient plate spring placed against said clousre means.

8. A device as claimed in claim 2, further comprising electrical insulation surrounding said electrodes where said electrodes pass through said envelope wall.

9. A vapor cooled semiconductor device comprising:
    an envelope having a pair of opposing side walls and a pair of openings through said side walls opposite each other;
    a semiconductor stack having two ends and fitted within said envelope casing, each end being positioned opposite one of said openings through said side walls, said semiconductor stack comprising:
        a pair of heat dissipation blocks,
        at least one semiconductor element sandwiched between said heat dissipation blocks,
        at least two electrodes, one on each side of said heat dissipation blocks opposite the side contacting said semiconductor element, said electrodes extending through said envelope wall, and
        electrical insulation against the sides of said electrodes opposite the sides thereof contacting said heat dissipation blocks;
    first and second closure means respectively fitted one in each of said openings through said side walls for hermetically closing said associated openings, said closure means being secured to the outer surfaces of said side walls and simultaneously abutting against the adjacent ends of said semiconductor stacks through said openings;
    first and second pressurizing means connected outside the side walls of said envelope adjacent said closure means for pressing said first and second closure means against said semiconductor stack, thereby pressurizing and holding said semiconductor stack; and
    cooling liquid partially filling said sealed envelope and surrounding said semiconductor stack, whereby said semiconductor is cooled by the latent heat of vaporization of said cooling fluid.

10. A device as claimed in claim 9, wherein said first and second closure means are respectively comprised of:
    a flexible bellows member hermetically sealed to and extending through said opening through the side wall of said envelope; and
    a closure member fitted within said bellows member, said closure member abutting said semiconductor stack at one end thereof and said pressurizing means at the other end thereof.

11. A device as claimed in claim 9, wherein said first and second pressurizing means are each comprised of a resilient plate biased against said closure means.

12. A device as claimed in claim 9, further comprising electrical insulation surrounding said electrodes where said electrodes pass through said envelope wall.

13. A vapor cooled semiconductor device comprising:
an envelope having a pair of opposing side walls and a pair of openings through said side walls opposite each other;
a semiconductor stack having two ends and fitted within said envelope casing, each end positioned opposite one of said openings through said side walls, said semiconductor stack comprising:
a pair of heat dissipation blocks,
at least one semiconductor element sandwiched between said heat dissipation blocks,
at least two electrodes, one on each side of said heat dissipation blocks opposite the side contacting said semiconductor element, said electrodes extending through said envelope wall, and
electrical insulation against the sides of said electrodes opposite the sides thereof contacting said heat dissipation blocks;
a resilient member abutting said semiconductor stack on the side thereof adjacent said opening;
closing means abutting the side of said resilient member opposite the side contacting said semiconductor stack and fitted over said opening in said sidewall for hermetically closing said opening and simultaneously pressurizing and holding said semiconductor stack through said resilient member; and
cooling liquid partially filling said sealed envelope and surrounding said semiconductor stack, whereby said semiconductor is cooled by the latent heat of vaporization of said cooling fluid.

14. A device as claimed in claim 13, wherein said semiconductor stack further abuts the inner surface of the side wall of said envelope opposite the sidewall containing said opening therethrough.

15. A device as claimed in claim 13, further comprising electrical insulation surrounding said electrodes where said electrodes pass through said envelope wall.

16. A vapor cooled semiconductor device, said device comprising:
an envelope having at least one pair of opposing side walls and having an opening through at least one of said side walls;
a semiconductor stack fitted within said envelope with one end facing toward said opening, said semiconductor stack comprising:
at least one semiconductor element, and
a pair of heat dissipation-electrode blocks, one block on each side of said semiconductor element, said heat dissipation blocks extending through said envelope walls and serving as electrodes surrounding said semiconductor element;
a resilient member abutting against the end of said semiconductor stack adjacent said opening;
closure means abutting the side of said resilient member opposite the side contacting said semiconductor stack and fitted over said opening for hermetically closing said opening and simultaneously pressurizing and holding said semiconductor stack through said resilient member; and
cooling fluid partially filling said sealed envelope and surrounding said semiconductor stack, whereby said semiconductor element is cooled by the latent heat of vaporization of said cooling fluid.

17. A device as claimed in claim 16 wherein said semiconductor stack further abuts the inner surface of the side wall of said envelope opposite the side wall containing said opening therethrough.

18. A device as claimed in claim 16, wherein the sidewalls of said envelope through which said heat dissipation-electrode blocks extend are comprised of electrically insulative material.

* * * * *